(12) United States Patent
Shimonishi et al.

(10) Patent No.: US 8,368,108 B2
(45) Date of Patent: Feb. 5, 2013

(54) LIGHT EMITTING ELEMENT HOUSING PACKAGE

(75) Inventors: Shota Shimonishi, Kiyosu-shi (JP); Hiroyuki Tajima, Kiyosu-shi (JP); Yosuke Tsuchiya, Kiyosu-shi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 13/137,930

(22) Filed: Sep. 21, 2011

(65) Prior Publication Data

US 2012/0074445 A1 Mar. 29, 2012

(30) Foreign Application Priority Data

Sep. 28, 2010 (JP) ................. 2010-217351

(51) Int. Cl.
*H01L 33/00* (2010.01)
(52) U.S. Cl. ............. 257/98; 257/99; 438/22; 438/25
(58) Field of Classification Search ............. 257/98–99, 257/E33.072; 438/22, 25
See application file for complete search history.

(56) References Cited

U.S. PATENT DOCUMENTS

2005/0133808 A1* 6/2005 Uraya et al. ............ 257/99

FOREIGN PATENT DOCUMENTS

| JP | 2007-201171 A | 8/2007 |
| JP | 2009-135536 A | 6/2009 |

* cited by examiner

*Primary Examiner* — Theresa T Doan
(74) *Attorney, Agent, or Firm* — McGinn IP Law Group, PLLC

(57) ABSTRACT

A light emitting element housing package comprises a ceramic substrate on which a light emitting element is mounted, and a wiring pattern that is formed on the ceramic substrate and to which a light emitting element chip is electrically connected, wherein a white thin film layer formed from a sintered body of white inorganic particles is formed on at least an upper surface of the wiring pattern, except a connection region in the wiring pattern to be connected to the light emitting element chip.

10 Claims, 3 Drawing Sheets

LIGHT EMITTING ELEMENT HOUSING PACKAGE

BACKGROUND OF THE INVENTION

1. Field of the Invention

The present invention relates to a light emitting element housing package.

2. Description of the Related Art

In order to enhance efficiency in extracting light from a light emitting element, a light emitting element housing package that houses an optical semiconductor light emitting element, such as an LED, has demanded a technique for hindering a wiring pattern from absorbing light from the light emitting element.

For instance, a proposed technique is for making a thin silver film exhibiting a high reflectance on a surface of a wiring pattern. However, a silver thin film is likely to cause a problem, like migration or oxidative corrosion, thereby raising a problem of low reliability (see Patent Document 1) and expensiveness.

Accordingly, a technique for forming a white resist layer exhibiting high reflectance on a surface of a wiring pattern has already been proposed as described in connection with Patent Document 2.

Patent Document 1: JP-A-2009-135536
Patent Document 2: JP-A-2007-201171

Under the technique described in connection with Patent Document 2, a synthetic resin that is a base material of a white resist layer undergoes aged deterioration because of heat and light. Since the white resist layer is likely to undergo yellow discoloration, the layer encounters difficulty in maintaining a white color for a long period of time. For this reason, there also arises a problem of efficiency in extracting light from a light emitting element being deteriorated with age.

SUMMARY OF THE INVENTION

The present invention has been conceived to solve the problem and aims at providing a package for housing a light emitting element that makes it possible to enhance the efficiency for extracting light from a light emitting element without involvement of aged deterioration.

As a result of having performed repeated diligent studies to solve the problem, the present inventors came around to the following aspects of the present invention as mentioned below.

A first aspect of the invention provides a light emitting element housing package comprising a ceramic substrate on which a light emitting element is mounted, and a wiring pattern that is formed on the ceramic substrate and to which a light emitting element chip is electrically connected, wherein a white thin film layer formed from a sintered body of white inorganic particles is formed on at least an upper surface of the wiring pattern, except a connection region in the wiring pattern to be connected to the light emitting element chip.

According to the first aspect of the invention, since the white thin film is formed on at least the upper surface of the wiring pattern, it is possible to make the wiring pattern have difficulty in absorbing the light of the light emitting element chip. The white thin film efficiently reflects the light of the light emitting element chip, and it is possible to uniformly emit outward. Since the white thin film is formed from a sintered body of white inorganic particles, there is little deterioration across ages by the heat or light. It is possible to keep white color for ages. Thus, it possible to enhance the efficiency for extracting light from a light emitting element without aged deterioration. Also, the white thin film does not set up a problem like migration or oxidative corrosion and gain high reliability. It is possible to inexpensively provide expensiveness, compared to the thin film of the silver.

A second aspect of the invention provides the light emitting element housing package, wherein the white thin film layer is made of the sintered body consisting of the white inorganic particles and inorganic binder particles.

A third aspect of the invention provides the light emitting element housing package, wherein a film thickness of the white thin film layer ranges from 5 to 50 μm.

The white thin film layer must be formed to a film thickness such that the film does not hinder superior emission of light from the light emitting element. Specifically, when a side surface portion of a light emission layer of the light emitting element is fully covered with the white thin film layer, the light originating from the light emission layer is blocked by the white thin film layer, so that the light cannot be extracted.

Accordingly, a film thickness of the white thin film layer must be set in such a way that the side surface portion of the light emission layer is not fully covered with the white thin film layer.

Moreover, when the film thickness of the white thin film layer is too small, the white thin film layer becomes easier to let light pass, so that the working effect yielded in connection with the first aspect cannot be yielded.

For this reason, it is desirable to set the film thickness of the white thin film layer to 5 to 50 μm.

DESCRIPTION OF THE PREFERRED EMBODIMENTS

Figure 1:
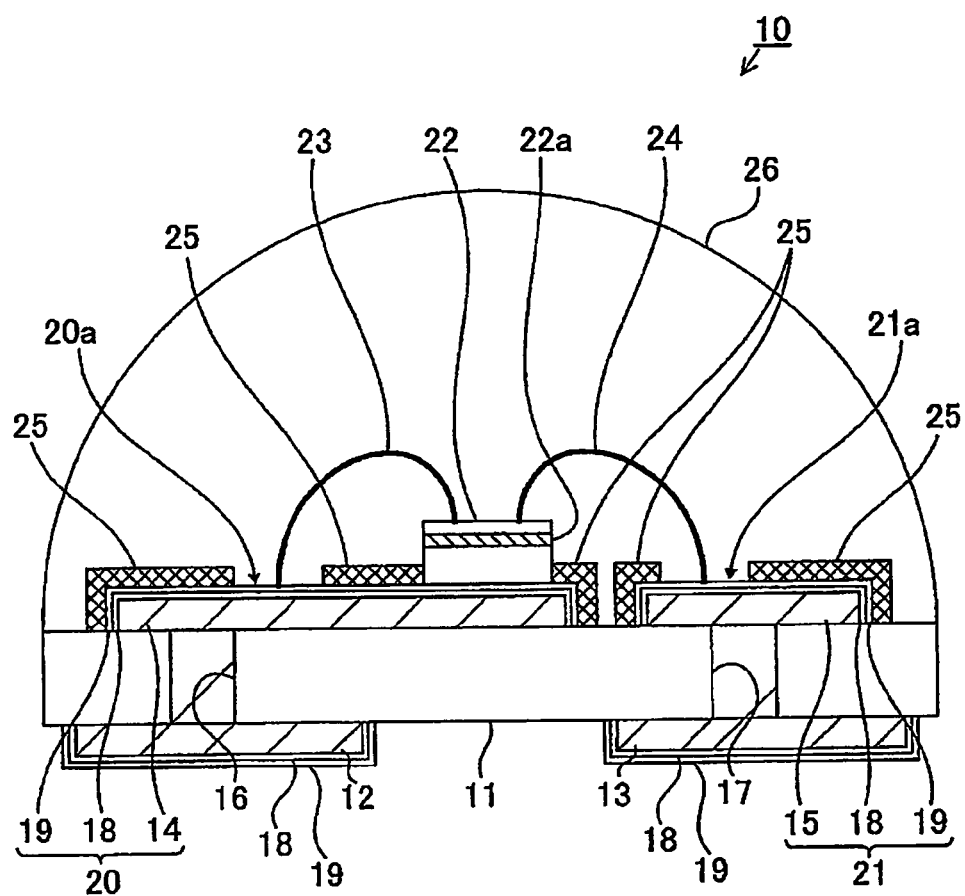
FIG. 1 is a longitudinal cross sectional view showing a general configuration of a light emitting element housing package 10 of a first embodiment embodying the present invention.

Embodiments embodying the present invention are hereunder described by reference to the drawings. In the embodiments, like constituent members are given like reference numerals, and repeated explanations of the same members are omitted.

<First Embodiment>

FIG. 1 is a longitudinal cross sectional view showing a general configuration of a light emitting housing package 10 of a first embodiment. The light emitting housing package 10 is made up of a ceramic substrate 11, lower electrode patterns (electrode layers) 12 and 13, upper electrode patterns 14 and 15, contact holes 16 and 17, a nickel (Ni) thin film layer 18, a gold (Au) thin film layer 19, wiring patterns (wiring layers) 20 and 21, connection regions 20a and 21a, a light emitting element chip 22, bonding wires 23 and 24, a white thin film layer 25, a translucent resin layer 26, and the like.

The plate-like ceramic substrate 11 is made of inexpensive sintered aluminum oxide (alumina ceramics).

The lower electrode patterns 12 and 13 are made of a a thick film layer of copper (Cu) and made by printing and applying Cu-containing conductor paste over a back side of the ceramic substrate 11 through use of a screen printing technique, or the like, and sintering the thus-printed substrate.

The upper electrode patterns 14 and 15 are formed from a thick copper film layer by means of printing and applying copper-containing conductor paste over a top side of the ceramic substrate 11 through use of the screen printing technique, or the like, and sintering the thus-printed substrate.

The contact holes 16 and 17 are formed in the ceramic substrate 11 in a penetrating fashion, so as to interconnect the front and back sides of the ceramic substrate 11. Cu-containing conductor paste is embedded in the contact holes 16 and 17, and the contact holes are then sintered, whereby a copper layer is formed.

The lower electrode pattern 12 and the upper electrode pattern 14 are integrally connected together by way of the copper layer in the contact hole 16. The lower electrode pattern 13 and the upper electrode pattern 15 are integrally connected together by way of the copper layer in the contact hole 17.

The nickel thin film layer 18 is formed so as to cover an overall surface of the upper electrode patterns 14 and 15 and an overall surface of the lower electrode patterns 12 and 13, by use of an electrolytic plating technique or a nonelectrolytic plating technique.

The gold thin film layer 19 is formed so as to cover the entire surface of the nickel thin film layer 18 by use of the electrolytic plating technique or the nonelectrolytic plating technique.

The wiring pattern 20 is formed from the upper electrode pattern 14 and the nickel thin film layer 18 and the gold thin film layer 19 that are formed over a surface of the upper electrode pattern.

The wiring pattern 21 is formed from the upper electrode pattern 15 and the nickel thin film layer 18 and the gold thin film layer 19 that are formed over a surface of the upper electrode pattern.

The light emitting element chip 22 is implemented as a result of being fixedly mounted on the wiring pattern 20, to thus be mounted on the ceramic substrate 11.

The light emitting element chip 22 is formed from; for instance, a bare chip of an optical semiconductor type light emitting element, like an LED element and an organic EL element.

A light emission layer 22a that substantially emits light is stacked on the light emitting element chip 22.

A positive electrode (omitted from the drawings) and a negative electrode (omitted from the drawings) are formed over an upper surface of the light emitting element chip 22.

The connection region 20a is arranged and formed on the wiring pattern 20, and the connection region 21a is arranged and formed on the wiring pattern 21.

By use of a wire bonding technique, the positive electrode of the light emitting element chip 22 and the connection region 20a are electrically connected by means of the bonding wire 23. The negative electrode of the light emitting element chip 22 and the connection region 21a are electrically connected together by means of the bonding wire 24.

The white thin film layer 25 is formed from; for instance, a sintered body consisting of white inorganic particles made of an aluminum oxide and inorganic binder particles made of silicon oxide. The white thin film layer is formed so as to cover upper surfaces of the wiring patterns 20 and 21 except the connection regions 20a and 21a.

The transparent resin layer 26 is made of a transparent silicon resin, a transparent epoxy resin, or the like, so as to cover respective members (i.e., the wiring patterns 20 and 21, the light emitting element chip 22, the bonding wires 23 and 24, and the white thin film layer 25) formed on the top side of the ceramic substrate 11 in a sealing fashion, and an upper surface of the transparent resin layer is formed into a substantially spherical shape.

[Working-Effects of the First Embodiment]

The light emitting element housing package 10 of the first embodiment can yield the working-effects, such as those provided below.

[1] The white thin film layer 25 covers the upper surfaces of the wiring patterns 20 and 21 except the connection regions 20a and 21a. Therefore, it becomes possible to make the wiring patterns 20 and 21 difficult to absorb light of the light emitting element chip 22, and the white thin film layer 25 efficiently reflects light of the light emitting element chip 22, to thus be able to radiate the light to the outside uniformly and excellently.

By use of a formation material to be described later, the white thin film layer 25 can exhibit high reflectance equal to that of a silver thin film.

[2] In the thin film layer of an organic material, like the white resist layer described in connection with Patent Document 2, a synthetic resin that a base material is susceptible to yellow discoloration through aged deterioration by means of heat or light. Therefore, the synthetic resin encounters difficulty in maintaining a white color over a long period of time, which raises a problem of deterioration of the efficiency for extracting light from the light emitting element chip 22 with age.

In contrast, since the white thin film layer 25 is made of a sintered body of white inorganic particles and hardly undergoes aged deterioration, which would otherwise be caused by heat and light, and can maintain a white color for a long period of time. Therefore, the efficiency for extracting light form the light emitting element chip 22 can be enhanced without involvement of aged deterioration.

The white thin film layer 25 is free from a problem, like migration or oxidative corrosion, as in the case of a silver thin film. In addition to its high reliability, the white thin film layer can be provided less expensive when compared with a silver thin film, so long as a formation material, which will be provided below, is used.

[3] The white thin film layer 25 is made by means of printing and applying paste that is a mixture of white inorganic particles and inorganic binder particles for promoting sintering of the white inorganic particles through use of the screen printing technique, or the like, and subsequently sintering the thus-printed paste.

It is preferable to use as the white inorganic particles; for instance, a titanium oxide, a boron nitride, a zirconium oxide, or the like, as well as an aluminum oxide.

Further, it is preferable to use as the inorganic binder particles; for instance, a magnesium oxide, a calcium oxide, and the like, as well as a silicon oxide.

The white thin film layer 25 is sintered at a temperature of about 500 to 600° C. The present inventors experimentally ascertained that there is no potential of the respective layers (the upper electrode patterns 14 and 15, the nickel thin film layer 18, and the gold thin film layer 19) making up the wiring patterns 20 and 21 being adversely affected during sintering operation.

[4] The white thin film layer 25 must be formed to a film thickness that does not block superior light emission of the light emitting chip 22.

Specifically, when a side surface portion of the light emission layer 22a of the light emitting element chip 22 is completely covered with the white thin film layer 25, the light radiated form the light emission layer 22a is blocked and not extracted by the white thin film layer 25.

Accordingly, the film thickness of the white thin film layer 25 must be set in such a way that the side surface portion of the light emission layer 22a is not completely covered with the white thin film layer 25.

If the film thickness of the white thin film layer 25 is made too small, light will become easier to pass through the white thin film layer 25, so that the working effect described in connection with [1] will become difficult to yield.

Therefore, it is desirable to set the film thickness of the white thin film layer 25 to; for instance, 5 to 50

<Second Embodiment>

Figure 2:
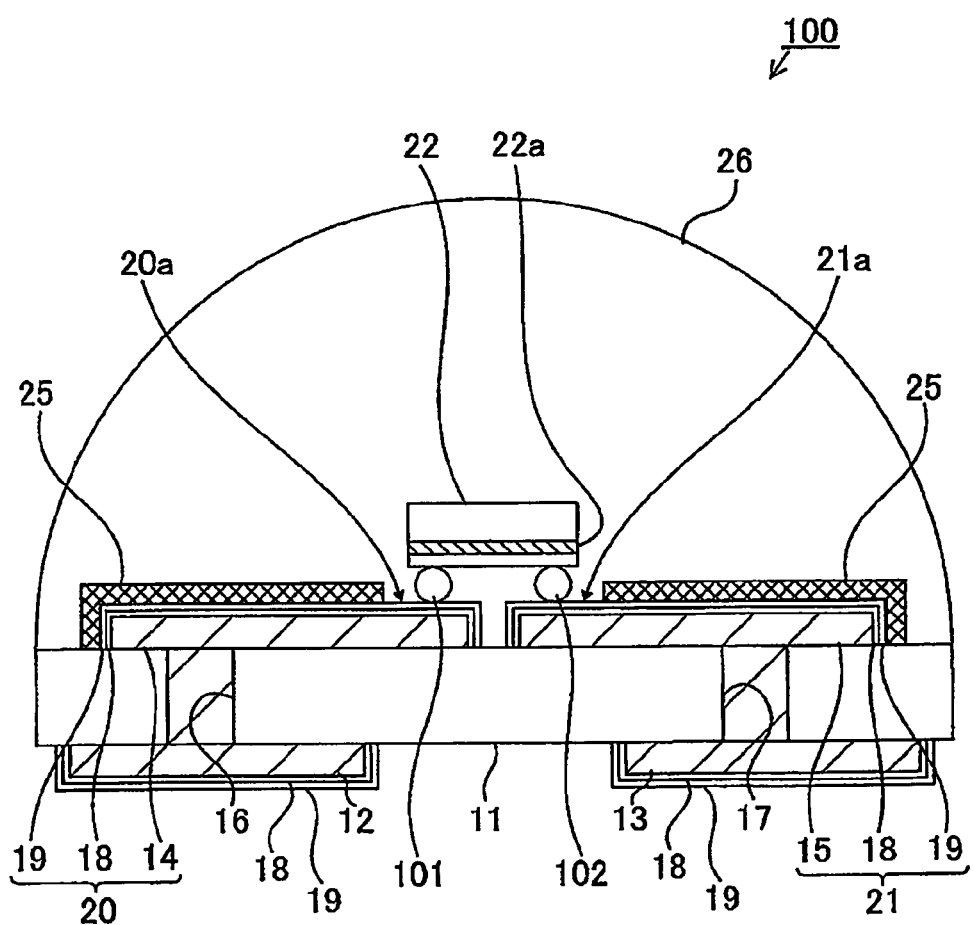
FIG. 2 is a longitudinal cross sectional view showing a general configuration of a light emitting element housing package 100 of a second embodiment embodying the present invention.

FIG. 2 is a longitudinal cross sectional view showing a general configuration of a light emitting element housing package 100 of a second embodiment.

The light emitting element housing package 100 is made up of the ceramic substrate 11, the lower electrode patterns 12 and 13, the upper electrode patterns 14 and 15, the contact holes 16 and 17, the nickel (Ni) thin film layer 18, the gold thin film layer 19, the wiring patterns 20 and 21, the connection regions 20a and 21a, the light emitting element chip 22, the white thin film layer 25, the transparent resin layer 26, bumps 101 and 102, and the like.

The light emitting element housing package 100 of the second embodiment differs from the light emitting element housing package 10 of the first embodiment in only that the light emitting chip 22 is flip-chip mounted by use of the bumps 101 and 102.

Specifically, the positive electrode of the light emitting chip 22 and the connection region 20a are electrically connected together by means of the bump 101. The negative electrode of the light emitting element chip 22 and the connection region 21a are electrically connected together by means of the bump 102.

The bumps 101 and 102 are made of; for instance, gold, solder, or the like.

Even the second embodiment also yields working effects identical with the working effects [1] to [4] described in connection with the first embodiment.

<Third Embodiment>

Figure 3:
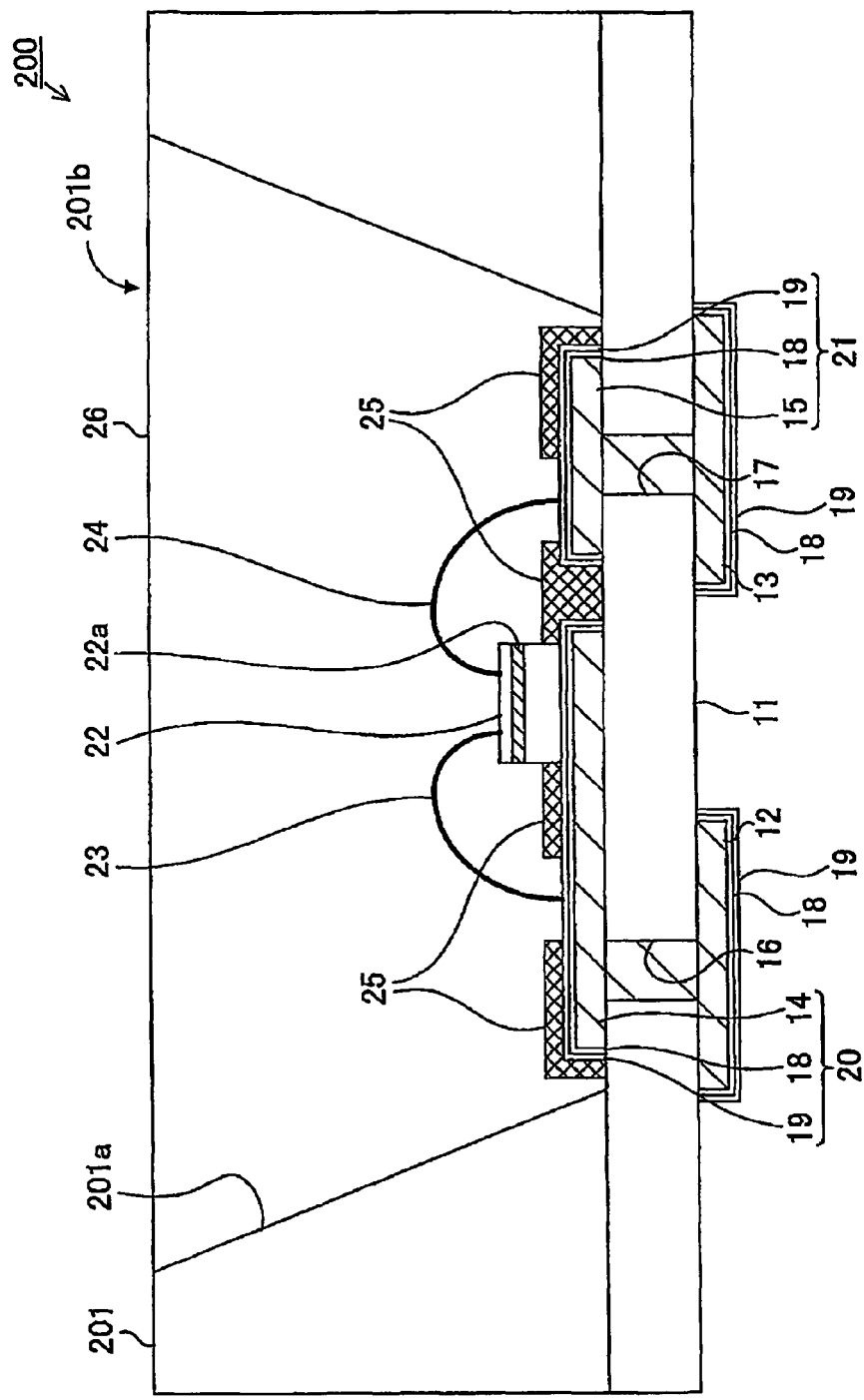
FIG. 3 is a longitudinal cross sectional view showing a general configuration of a light emitting element housing package 200 of a third embodiment embodying the present invention.

FIG. 3 is a longitudinal cross sectional view showing a general configuration of a light emitting element housing package 200 of a third embodiment.

The light emitting element housing package 200 is made up of the ceramic substrate 11, the lower electrode patterns 12 and 13, the upper electrode patterns 14 and 15, the contact holes 16 and 17, the nickel thin film layer 18, the gold thin film layer 19, the wiring patterns 20 and 21, the connection regions 20a and 21a, the light emitting element chip 22, bonding wires 23 and 24, the white thin film layer 25, the transparent resin layer 26, a reflector 201, and the like.

The light emitting element housing package 200 of the third embodiment differs from the light emitting element housing package 10 of the first embodiment in only that the reflector 201 is provided.

The reflector 201 is made of a synthetic resin, ceramics, and the like, and fixedly mounted on the front side of the ceramic substrate 11 so as to surround the respective members (the wiring patterns 20 and 21, the light emitting element chip 22, the bonding wires 23 and 24, and the white thin film layer 25).

In the reflector 201, an inner peripheral surface of a recess 201a forms a slope that is inclined toward an aperture 201b. The reflector reflects light from the light emitting chip 22, to thus be able to efficiently emit the light from the aperture 201b.

The recess 201a of the reflector 201 is filled with the transparent resin layer 26.

Even the third embodiment yields working effects identical with the working effects [1] to [4] described in connection with the first embodiment.

In the third embodiment, the light emitting element chip 22 may also be flip-chip mounted in the same way as in the second embodiment.

The present invention shall not be limited to descriptions about the respective phases and the embodiments. Various deformations of the embodiments shall also fall within the scope of the present invention without departing descriptions of the appended claims to an extent that the skilled in the art can readily conceive the deformations. All details of theses, unexamined patent publication bulletins, patent publications, or the like, referred to in the present patent specification are cited by reference.

What is claimed is:

1. A light emitting element housing package, comprising:
   a ceramic substrate on which a light emitting element is mounted; and
   a wiring pattern that is formed on the ceramic substrate and to which a light emitting element chip is electrically connected,
   wherein a white thin film layer comprising a sintered body of white inorganic particles is formed on at least an upper surface of the wiring pattern, except a connection region in the wiring pattern to be connected to the light emitting element chip.

2. The light emitting element housing package according to claim 1, wherein the white thin film layer comprises a sintered body comprising said white inorganic particles and inorganic binder particles.

3. The light emitting element housing package according to claim 1, wherein a film thickness of the white thin film layer ranges from 5 μm to 50 μm.

4. A light emitting element package, comprising:
   a ceramic substrate;
   an electrode provided on the ceramic substrate;
   a wiring pattern comprising the electrode;
   a light emitting element chip mounted on the wiring pattern;
   a bonding wire connecting the electrode and the light emitting element chip, a connection region being defined to be where the wiring pattern meets the bonding wire; and
   a white thin film layer comprising a sintered body comprising white inorganic particles, the white thin film layer being configured to cover an upper surface of the wiring pattern except for the connection region.

5. The light emitting element package of claim 4, further comprising a nickel thin film layer configured to cover a surface of the electrode.

6. The light emitting element package of claim 5, further comprising a gold thin film layer configured to cover a surface of the nickel thin film layer.

7. The light emitting element package of claim 4, further comprising a light emission layer configured to substantially emit light, and provided on the light emitting element chip.

8. The light emitting element package of claim 4, wherein said white inorganic particles comprise an aluminum oxide and inorganic binder particles.

9. The light emitting element package of claim 8, wherein said inorganic binder particles comprise silicon oxide.

10. A light emitting element package, comprising:
    a light emitting element chip formed on a wiring pattern;
    a bonding wire connecting an electrode to the light emitting element chip at a connection region; and
    a white thin film layer comprising a sintered body comprising white inorganic particles, the white thin film layer being configured to cover the wiring pattern except for the connection region.

* * * * *